United States Patent [19]
Street et al.

[11] Patent Number: 5,117,114
[45] Date of Patent: May 26, 1992

[54] HIGH RESOLUTION AMORPHOUS SILICON RADIATION DETECTORS

[75] Inventors: Robert A. Street, Palo Alto; Selig N. Kaplan, El Cerrito; Victor Perez-Mendez, Berkeley, all of Calif.

[73] Assignee: The Regents of the University of California, Oakland, Calif.

[21] Appl. No.: 448,240

[22] Filed: Dec. 11, 1989

[51] Int. Cl.$^5$ .............................................. G01T 1/24
[52] U.S. Cl. ........................... 250/370.11; 250/370.09; 250/370.14; 357/2
[58] Field of Search ...................... 250/370.11, 370.09, 250/370.14; 357/2

[56] References Cited

U.S. PATENT DOCUMENTS

| | | | |
|---|---|---|---|
| 4,163,240 | 7/1979 | Swinehart et al. | 357/29 |
| 4,303,860 | 12/1981 | Bjorkholm et al. | 250/368 |
| 4,409,605 | 10/1983 | Ovshinsky et al. | 357/2 |
| 4,419,578 | 12/1983 | Kress | 250/390 |
| 4,419,696 | 12/1983 | Hamano et al. | 358/294 |
| 4,500,744 | 2/1985 | Nozaki et al. | 136/258 |
| 4,611,224 | 9/1986 | Seki et al. | 357/30 |
| 4,755,880 | 10/1988 | Suzuki et al. | 357/30 |
| 4,785,186 | 11/1988 | Street et al. | 250/370.14 |
| 4,810,881 | 3/1989 | Berger et al. | 250/370.09 |
| 4,891,522 | 1/1990 | Coon et al. | 250/370.14 |
| 4,940,901 | 7/1990 | Henry et al. | 250/370.11 |
| 4,980,553 | 12/1990 | Henry | 250/370.11 |

FOREIGN PATENT DOCUMENTS

| | | | |
|---|---|---|---|
| 113690 | 5/1989 | Japan | 250/370.11 |
| 126583 | 5/1989 | Japan | 250/370.11 |

OTHER PUBLICATIONS

Wei et al., "Amorphous-Silicon Photovoltaic X-Ray Sensor", Japan Journal of Applied Physics, vol. 24 (1985), p. 1105.

Mochiki et al., "Amorphous Silicon Position-Sensitive Detector", Nuclear Instruments and Methods in Physics Research, vol. A273 (1988), pp. 640-644.

Perez-Mendez et al., "The Application of Thick Hydrogenated Amorphous Silicon Layers to Charged Particles and X-Ray Detection", Lawrence Berkeley Laboratory Report No. LBL-26998 (Apr. 1989).

Kubota et al., "A New Scintillation Material: Pure CsI with 10ns Decay Time", Nuclear Instruments and Methods in Physics Research, vol. A268 (1988), pp. 275-277.

Kubota et al., "The New Scintillation Material CsI and Its Application to Position Sensitive Detectors", Nuclear Instruments and Methods in Physics Research, vol. A273 (1988), pp. 645-649.

A. L. N. Stevens et al., "Vapor-Deposited CsI:Na Layers, I. Morphologic and Crystallographic Properties", Philips Res. Repts., vol. 29 (1974), p. 340.

Miyahara et al., "A New Type of X-Ray Area Detector Utilizing Laser Stimulated Luminescence", Nucl. Instrum. and Methods in Physical Research, vol. A246 (1986), pp. 572-578.

*Primary Examiner*—Carolyn E. Fields

[57] ABSTRACT

A radiation detector employing amorphous Si:H cells in an array with each detector cell having at least three contiguous layers (n type, intrinsic, p type), positioned between two electrodes to which a bias voltage is applied. An energy conversion layer atop the silicon cells intercepts incident radiation and converts radiation energy to light energy of a wavelength to which the silicon cells are responsive. A read-out device, positioned proximate to each detector element in an array allows each such element to be interrogated independently to determine whether radiation has been detected in that cell. The energy conversion material may be a layer of luminescent material having a columnar structure. In one embodiment a column of luminescent material detects the passage therethrough of radiation to be detected and directs a light beam signal to an adjacent a-Si:H film so that detection may be confined to one or more such cells in the array. One or both electrodes may have a comb structure, and the teeth of each electrode comb may be interdigitated for capacitance reduction. The amorphous Si:H film may be replaced by an amorphous Si:Ge:H film in which up to 40 percent of the amorphous material is Ge. Two dimensional arrays may be used in X-ray imaging, CT scanning, crystallography, high energy physics beam tracking, nuclear medicine cameras and autoradiography.

15 Claims, 7 Drawing Sheets

HIGH RESOLUTION AMORPHOUS SILICON RADIATION DETECTORS

This invention was made, in part, with U.S. Government support under Contract No. DE-AC03-76SF00098, awarded by the Department of Energy. The Government has certain rights in this invention.

DESCRIPTION

1. Technical Field

This invention relates to amorphous silicon radiation imaging arrays with high resolution read-out.

2 Background of the Invention

Hydrogenated amorphous silicon (a-Si:H) is now widely used in industry as a material for solar cells, facsimile heads and liquid crystal display drivers. The thickness of a-Si:H layers used in such devices is usually less than 2 $\mu$m, which is sufficient to absorb all of the visible light incident thereon and to provide enough material to construct thin film transistors ("TFTs"). Early efforts to make radiation detectors with a-Si:H were limited to small thickness ranges of a few microns. Wei et al., *Japan Jour. Appl. Phys.*, vol. 24 (1985) 1105 ff., made a sixteen element X-ray sensor whose intensity could be improved by coupling to a phosphor such as $CdWO_4$ and ZnS:Ni for use with X-ray films. Mochiki et al., *Nucl. Instr. and Methods*, vol. A 273 (1988) 640 ff., used a facsimile head to detect X-ray fluences and obtained similar results with improved spatial resolution. Naruse et al., *I.E.E.E. Trans. Nucl. Sci.*, vol. NS-36 (1989) 1347–1352, proposed a metal/a-Si:H multilayer structure that resembles a miniature calorimeter for radiation detection.

One unsolved problem here is the presence of large detector capacitance, which limits the short time response of the system. The a-Si:H layers in these devices are limited to a few $\mu$m thickness, and the electrodes are all parallel plates so that detector capacitance is fairly large. It is, therefore, difficult to operate these devices in a pulse mode for counting individual particles. Our recent work has focused on making a-Si:H layers up to 50 $\mu$m thickness with low detector capacitance for single particle counting. See, for example, V. Perez-Mendez et al., "The Application of Thick Hydrogenated Amorphous Silicon Layers to Charged Particle and X-ray Detection", Lawrence Berkeley Laboratory Report No. LBL-26998 (April, 1989).

Swinehart et al., in U.S. Pat. No. 4,163,240, disclose a fast neutron dosimeter that uses a p+ —i—n+diode structure to provide a fast neutron dosimeter, where the diode thickness may range from 30 mils to about 200 mils. Silicon resistivity is relatively small, of the order of 50 Ohm-cm, and the use of crystalline silicon is contemplated here.

An amorphous semiconductor body that is nearly equivalent to a crystalline semiconductor body is disclosed by Ovshinsky et al. in U.S. Pat. No. 4,409,605. This structure uses both fluorine and hydrogen as compensating agents to reduce the localized defect states in the energy gap of the amorphous semiconductor material.

Kress discloses a solid state neutron detector in U.S. Pat. No. 4,419,578. The detector comprises a first layer of neutron-sensitive material and a second layer of semiconducting material that is itself sensitive to the passage of neutrons therethrough. A grid pattern of stacked detectors is provided to allow some determination of the direction of travel of the incident neutrons.

Hamano et al., in U.S. Pat. No. 4,419,696, disclose a thin film reader that uses an amorphous silicon film sandwiched between a transparent electrode and a metal electrode and formed on an insulating substrate. The layer of amorphous silicon is preferably all intrinsic or all p type.

A photovoltaic device using amorphous silicon in a p-i-n diode structure is disclosed by Nozaki et al. in U.S. Pat. No. 4,500,744. Light enters the amorphous silicon layer through the transparent substrate, and electrons or holes generated in the silicon are drawn to an ohmic contact positioned on the other side of the silicon. The energy gap of material adjacent to the substrate is smaller than the energy gap of material closer to the ohmic contact, in order to promote photovoltaic activity in the silicon material.

In the Seki et al. patent, U.S. Pat. No. 4,611,244, a radiation detector is disclosed in which a block of crystalline silicon is coated with an amorphous silicon film containing an impurity in order to widen the mobility bandgap of the semiconductor and thereby reduce reverse bias leakage current. The impurity incorporated in the amorphous film, phosphorus or carbon, appears to increase the energy gap in the film material relative to the energy gap in the crystalline material.

In U.S. Pat. No. 4,775,880, Suzuki et al. disclose an amorphous silicon photoconductive cell array having two electrodes that are interdigitated with respect to one another in a particular configuration in order to suppress current leakage between adjacent sensing electrodes. The two electrodes are comb-shaped and lie on the same side of the silicon, and the teeth of one electrode enclose the teeth of the electrode of opposite polarity in order to suppress the leakage current. Selective read-out of different cell units in the array is also provided, through interrogation of a group of cell units in the same time interval.

U.S. Pat. No. 4,785,186, issued to Street et al., discloses use of a thin film of hydrogenated amorphous silicon, a-Si:H, formed as three monolithic layers in a p-i-n film that is sandwiched between two metal electrodes with reverse bias applied. Penetration of inbound high energy particles generates electron-hole pairs in the amorphous silicon and produces a measurable output current signal.

What is needed here is a high resolution particle detector that offers high sensitivity, flexibility as to the type of particle detected, and high resolution in location of a particle in a small geometrical region in which the particle is detected.

SUMMARY OF THE INVENTION

These needs are met by an array of detector elements, with each detector element including first and second planar, spaced apart electrodes, an amorphous Si:H film that is deposited between and is adjacent to the electrodes and a layer of energy converter material. The film contains at least three contiguous regions, namely n type, intrinsic and p type in that order, and the intrinsic region has a low charge particle trap density. A voltage bias is applied between the first and second electrodes to impress an electric field of strength of the order of 1–50 volts/$\mu$m between the electrodes, and a substrate supports the Si:H film. Each detector element is of a size as small as 10–300 $\mu$m, and includes a readout device for each detector element, positioned adjacent to the electrodes and connected thereto, for reading the voltage or current developed across the film of a selected detector element at an arbitrary time.

The energy converter material, such as the phosphor CsI:Na with various activators or CsI with an Na impurity may be fabricated with a columnar structure to provide a plurality of small diameter light pipes, to direct the phosphorescence radiation propagating in a column to a single detector element with little or no lateral spreading of the light. This layer converts incident charged particles or gamma radiation, or fluences of both, to light of a wavelength to which the detector is sensitive.

The array of detector elements can be one-dimensional or can be two-dimensional, and the device may be used for particle fluence measurements in an accumulation mode or for single particle counting in a pulse mode. Time intervals for detection of incident particles may be as short as 10 nsec. The array can be used for high resolution detection of ultraviolet light, X-rays, gamma-rays and high energy charged and uncharged particles.

BRIEF DESCRIPTION OF THE DRAWINGS

FIGS. 9a and 9b are a top view and a side sectional view, respectively, of an electrode arrangement in accordance with the invention, the sectional view being taken along lines A—A of the top view.

FIG. 10b is a graphical view of the relative electrical field versus position inside a semiconductor, with position scale represented as in FIG. 10a.

BEST MODE FOR CARRYING OUT THE INVENTION

Figure 1:
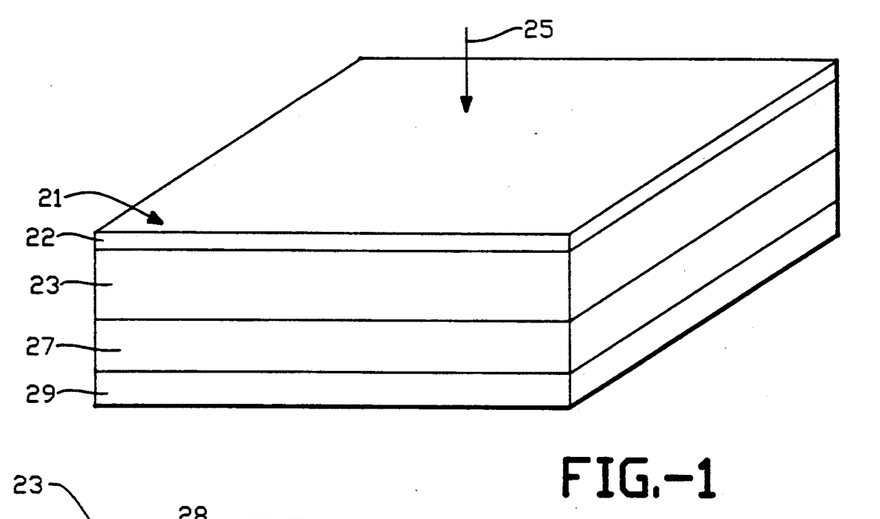
FIG. 1 is a generalized representation of the invention.

With reference to FIG. 1, the radiation detector 21 of the present invention includes an array 23 of amorphous silicon cells below energy converter layer 22 positioned to receive a beam of charged particles 25 or gamma or X-ray fluence that is incident on one face of the detector array. For purposes of this application, the term "beam" should be understood to mean a fluence of charged particles or X-rays (1 keV–511 keV) or gamma rays (above 511 keV). The cell array 23 is positioned adjacent to a readout electronics circuit 27 that may be supported by a substrate 29.

Figure 2:
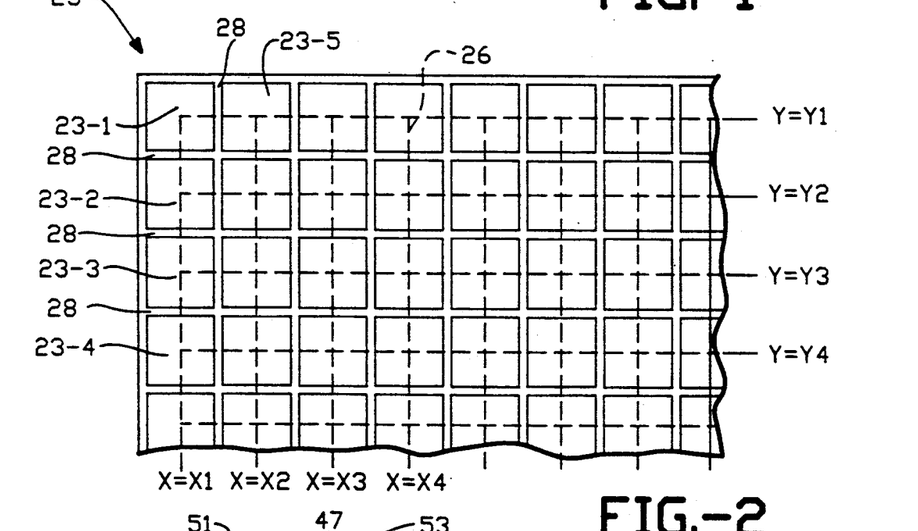
FIG. 2 is a top plan view of a two-dimensional rectangular array of square amorphous silicon cells with underlying readout electronics in accord with the invention.
Figure 3:
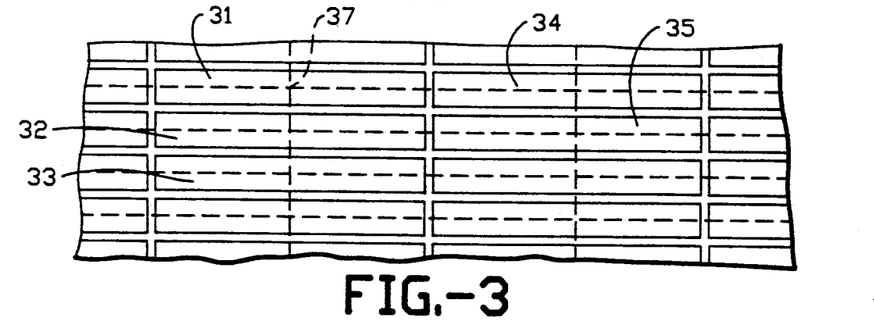
FIG. 3 is a top plan view of a two-dimensional rectangular array of rectangular amorphous silicon cells with underlying readout electronics in accord with the invention.

The amorphous silicon cell array 23, shown in FIG. 2, includes individual square cells 23-1, 23-2, 23-3, 23-4, 23-5, etc. spaced apart by grooves 28. The cells are formed in or adjacent to a plane, where a corresponding point on each detector element is assigned a pair of rectangular coordinates (x,y) that locate that point in a rectangular grid in the plane, as illustrated in FIG. 2. Thus, for example, the cells 23-3 and 23-5 have the respective coordinate pairs $(x_1, y_3)$ and $(x_2, y_1)$ The dashed x,y lines 26 are intended to depict underlying electrical addressing wires explained in greater detail with reference to FIG. 7. The two-dimensional rectangular array shown in FIG. 2 may be replaced by a rectangular array with rectangular silicon cells 31, 32, 33, 34, 35, etc., as shown in FIG. 3, with detector element locations being electrically addressed by underlying wires 37 in the same manner as in FIG. 2. Alternatively, the cell array may be a one-dimensional linear array, with detector element locations specified by a single coordinate such as x or y.

Figure 4:
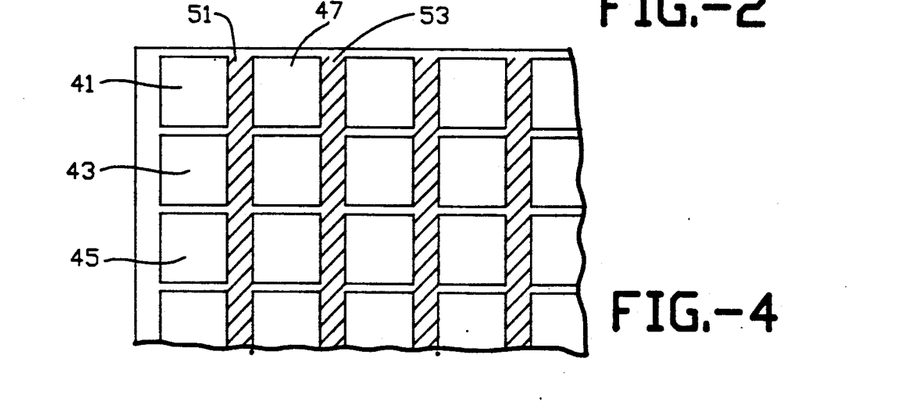
FIG. 4 is a top plan view of a two-dimensional rectangular array of square amorphous silicon cells with side-by-side readout electronics in accord with the invention.

In FIG. 4, the square silicon cells 41, 43, 45, 47, etc. are spaced apart with the readout electronics occupying the gap between cells. These gaps, such as 51 or 53, should be sufficiently wide enough to accommodate readout electronics between cells. Alternatively, the readout electronics may be positioned just below or just above the "plane" containing the silicon cells 41, 43, 45, 47. The readout electronics will be said to be positioned "adjacent" to the silicon cells if the electronics is positioned in the cell gaps or is positioned just above or just below the "plane" containing the silicon cells. Electronics for the cells may occupy the space between cells. Since photolithographic processes are used for fabrication, a side-by-side arrangement will reduce the overall number of process steps and reduce problems of mask alignment. On the other hand, for higher cell resolution, a stacked arrangement, shown in FIGS. 1 and 2 is preferred.

Figure 5:
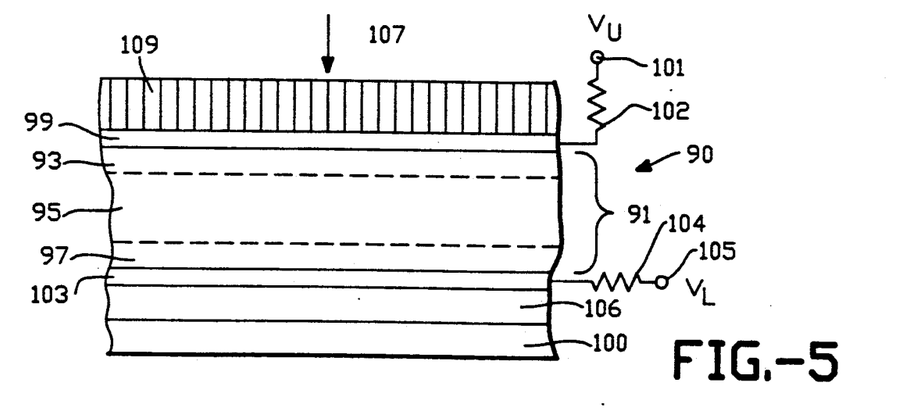
FIG. 5 is a side sectional plan view of a detector element in accordance with the invention.

A detector element itself 90 has the structure shown in FIG. 5 in one embodiment, where the semiconductor layer or film 91 includes a hydrogenated amorphous silicon ("a-Si:H") film that has at least three contiguous layers, a first thin layer 93 that is doped n type, a thick layer 95 of intrinsic a-Si:H, and a second thin layer 97 that is doped p type, with the intrinsic layer 95 lying between the layers 93 and 97. A first electrode 99 is positioned adjacent to the n type layer 93 of a-Si:H, with a first voltage source 101 of voltage $V_U$ connected to the first electrode. A second electrode 103 is positioned adjacent to the p type layer 97 of a-Si:H, with a second voltage source 105 of voltage $V_L$ ($V_L < V_U$) connected to the second electrode. One of the voltage sources 101 and 105 may be at ground potential so that only one additional voltage source is needed. When a beam 107 produces light in the energy conversion material, preferably in the wavelength range 400-700nm, but definitely below 800 nm, electrons or electron-hole pairs will be produced in the a-Si:H film 91, and a current flow or voltage drop will be detected between the two electrodes 99 and 103 of the detector element 90. The current will be read in the electronics layer 106, just above substrate 100.

The detector element 90 includes a converter or scintillator layer 109 that intercepts the particle beam 107 or 108 before the beam enters the amorphous film 91. The converter layer 109 is a unitary assembly of luminescent (fluorescent or phosphorescent) atoms or molecules, preferably 100-500 $\mu$m thick, that reacts to scattering or absorption of particles in this layer by emission of light in a band of wavelengths that is characteristic of the converter material. The converter layer 109 may be in the form of a continuous film with transverse dimensions from 30 $\mu$m to as high as desired. Scattering of particles from the beam 107 produces photons, some of which propagate through the electrode 99 and into the amorphous film 91. These undergo Compton scattering and photoelectron production in the film 91 and thereby produce electrons or electron-hole pairs that produce a detectable current. About 2-5 $\mu$m thickness of a-Si film will collect most of the light. Each detector element 90 has a readout device that specifically reads out the current flowing between, or the voltage drop between, the electrodes of that detector element.

Figure 6:
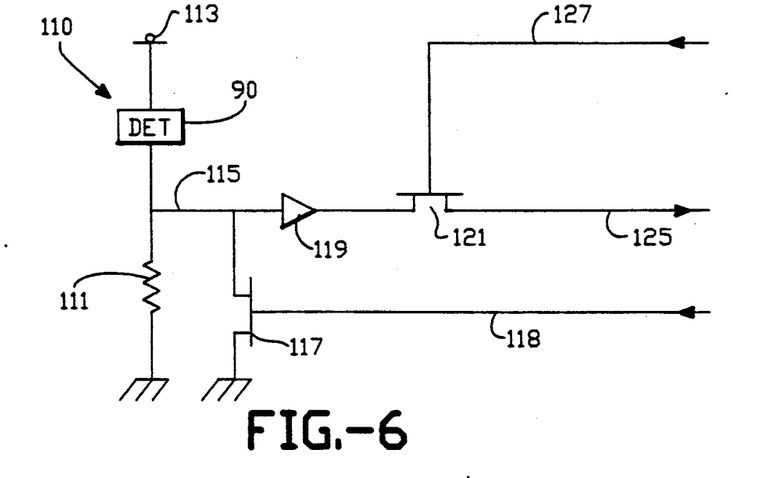
FIGS. 6 and 7 are simplified schematic views of readout electronics in accordance with the invention.

FIG. 6 illustrates a typical readout circuit 110 that is suitable for determining whether a particular detector element, located by a particular pair of coordinates (x,y) or by a single coordinate in a one-dimensional array, has detected the passage therethrough of any beam particles. The detector element 90 has one electrode ("active electrode") connected to a voltage source at terminal 113 and has the other electrode grounded through a resistor 111. The active electrode is connected to an electrode signal line 115 that is grounded through a first transistor 117 whose conductivity or on-off status is controlled by a reset signal received on a reset signal line 118 at the control terminal of the transistor.

As used herein the word "transistor" will refer to a field effect transistor ("FET") having a control gate and having a first terminal (drain or source) for receiving an input signal from a a-Si:H cell 90 and having a second terminal (source or drain) for issuing an output signal. The electrode signal line 115 is connected to an input terminal of an amplifier 119 (optional) whose output terminal is connected to a first terminal of a second transistor 121. The second terminal of the second transistor 121 is connected to the output line 125. The gate of the transistor 121 receives a query or x-address signal on line 127. The output line 125 of transistor 121 is read as the other coordinate. A reset transistor 117, optional, clears the electrode signal line 115. A signal appearing on the electrode signal line 115 will also appear on the output signal line 125 only if the control signal line 127 is activated.

Figure 7:
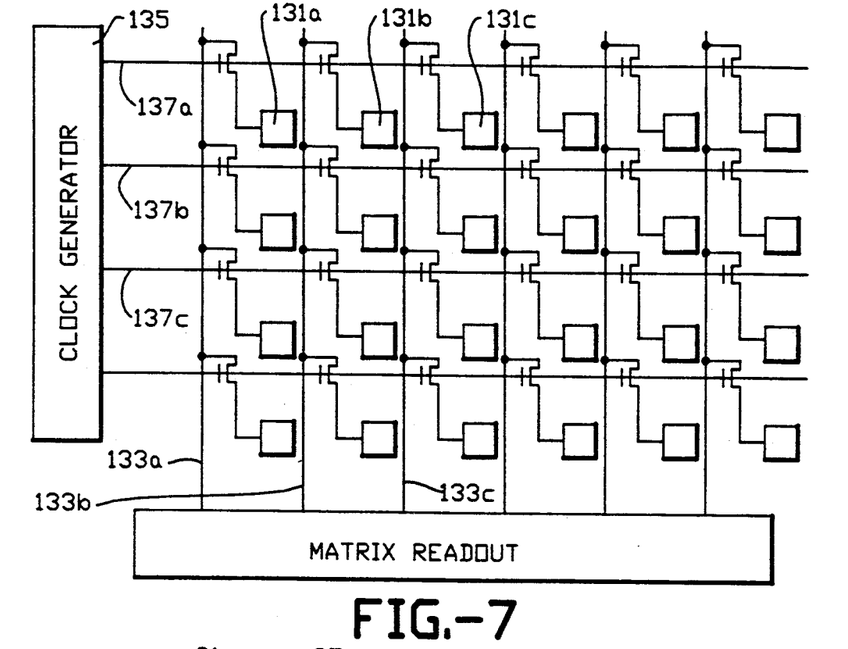

With reference to FIG. 7, a rectangular array 130 of a-Si:H cells 131a, 131b, 131c, and so on, may be seen to be connected in a grid pattern. Y-address lines 133a, 133b, 133c are connected to electrical circuits of the type shown in FIG. 6. X-addresses are provided by a pulse generator, such as the clock generator 135 which sequentially applies pulses to lines 137a, 137b, 137c and so on. Read-out electronic devices within block 135 look to the output circuits by applying a query signal to lines 133a, 133b, 133c and so on in a particular sequence at an appropriate rate, either faster or slower, compared to the rate of pulse generator 135, so that each cell having a coordinate address may be read. Read-out circuits are well known and, in simplest form, merely involve the measurement of charge on each line, as each line is scanned.

Many other embodiments of the readout device for the detector element may be devised, the main requirement being that, for a two-dimensional array of detector elements, two independent activating signals representing the two coordinates must be received in order to issue as an output signal the signal sensed across the detector element electrodes. For a one-dimensional array, only one activating signal need be received to issue the detector element output signal.

Figure 8:
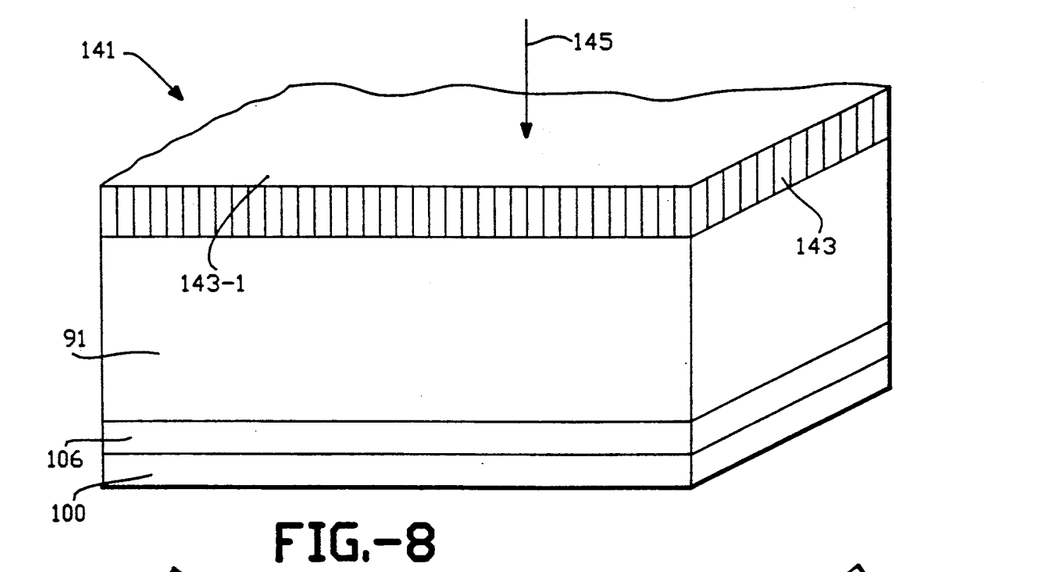
FIG. 8 is a perspective view of a columnar converter or scintillator layer atop a cell array in accord with the invention.

One of the energy conversion materials relied upon for some of the embodiments of the invention disclosed herein is a scintillation face plate or layer 141 as shown in FIG. 8. A scintillation face plate is a thick layer of luminescent or similar material 143 that receives the beam 145 and causes beam particles or radiation to scatter against the atoms of the converter material to produce light in a characteristic range of wavelengths. The scintillation face plates of interest here may be fabricated from glass fibers that contain rare earth elements and are fused and drawn to form columnar structures of diameters of the order of 10-100 $\mu$m. Light produced by scattering of the beam particles in the converter layer 143 is constrained to propagate in a single fiber, most of which reaches the semiconductor layer 91 for readout in electronics layer 106 above substrate 100. Thus, the degradation of spatial resolution that is normally caused by light spread in the converter material is minimized or eliminated in this indirect detection scheme. The light yield of the rare earth element scintillation face plates is often not high enough to detect single minimum ionizing particles, and the wavelength range of such materials is often too high to permit particle detection in a semiconductor layer such as 91 in FIG. 5 of thickness no more than 1-5 $\mu$m. However, such rare earth element scintillation face plates are adequate for detecting fluences in an integration or accumulation mode operation.

Recently, Kubota et al., Nucl. Instr. and Methods, vol. A268 (1988) 275-277, and vol. A273 (1988) 645-649, reported on studies of a new scintillation material, pure CsI, which has a fast decay curve with a characteristic time of 10 nsec and a slower decay with a characteristic decay time of 36 nsec. The rapidly decaying contribution has a amplitude about three times the amplitude of the slower decaying contribution. Fast decay with a lifetime much less than 1 $\mu$sec is desirable here. Pure CsI also has a broad band with a characteristic decay time of 1-4 $\mu$sec that varies from sample to sample. The peak intensity of CsI is as large as that of two other attractive materials, CaI:Na and CsI:Tl, and the wavelength-integrated intensities have similar magnitudes. Pure CsI, CsI:Na, and CsI:Tl have emission intensity peaks at wavelengths around 0.3, 0.43 and 0.55 $\mu$m, respectively, so that these phosphors cover an attractive range of near-ultraviolet and visible wavelength emissions. Table I sets forth a group of phosphors and other luminescent materials with emission wavelengths in the near-ultraviolet and visible wavelength range.

TABLE I

| Luminescent Material | Peak Emission Wavelength |
|---|---|
| CsI | 0.3 μm |
| LaOBr:Tb | 0.35-0.5 |
| BaPbSO$_4$ | 0.37 |
| BaSrSO$_4$ | 0.39 |
| BaFCl:Eu$^{++}$ | 0.39 |
| CsI:Na | 0.43 |
| CaWO$_4$ | 0.43 |
| (ZnCd)S:Ag | 0.53 |
| GdO$_2$:Tb | 0.545 |
| CsI:Tl | 0.55 |

Pure or doped CsI may be made by several methods, including vacuum evaporation that forms columns of the material parallel to the evaporation direction. The column diameter can be controlled by heat treatment, according to a report by A.L.N. Stevens et al., Philips Res. Repts., vol. 29 (1974) 340, and the diameter can be varied from about 10 μm to higher than 100 μm. Films of CsI:Na 300 μm thick with column diameters of 50 μm are routinely made. Thicker CsI face plates or plates with a larger column diameter can be made by melting and recrystallizing the CsI inside a honeycomb structure, if desired. Here, interest centers on small diameter columns to provide high resolution particle detection.

Figures 9A, 9B, 10B:
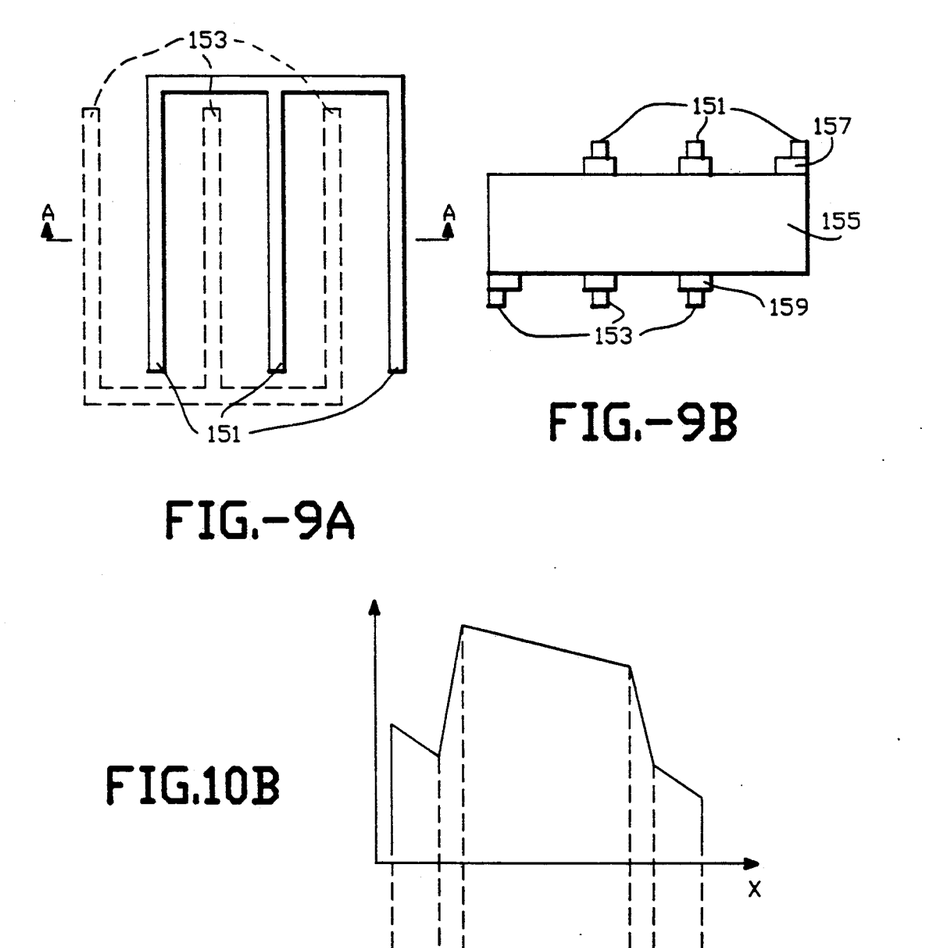

A low capacitance electrode structure that may be utilized in the invention is shown in FIG. 9a and in FIG. 9b. Two interdigitated electrodes 151 and 153, each formed in a comb structure with a plurality of two or more teeth, are positioned on opposite sides of an intrinsic a-Si:H layer. The intrinsic layer may be provided with a thin, doped n type region on one side and a thin doped p type region on the other side of the layer as shown in FIG. 5. Alternatively, in FIG. 9b, a p type film 157 may be provided between the intrinsic layer 155 and each of the teeth of the comb-shaped electrode 151; and an n type film 159 may be provided between the intrinsic layer 155 and each tooth of the comb-shaped electrode 153. This structure takes advantage of the well known Schottky barrier phenomenon that develops when a metal(electrode) is positioned contiguous to a doped semiconductor film and a forward bias voltage is applied thereto. The configuration shown in FIG. 9b offers very low charge recovery times so that high frequency signals initiated in the intrinsic layer 155 can be sensed at the electrodes 151 and 153.

The interdigitated electrode structure shown in FIGS. 9a and 9b provides a small capacitance between the electrodes but may require use of a larger bias or voltage difference impressed between the electrodes 151 and 153. The electrical field in the a-Si:H layer 155 shown in FIGS. 9a and 9b is non-uniform and may have other interesting properties. In another alternative, one of the electrodes shown in FIGS. 9a or 9b may be replaced by a continuous, planar electrode of conventional design so that only one such electrode (closest to the source of the beam of particles) is formed as a comb having two or more teeth.

For direct detection of high linear energy transfer charged particles, such as alpha particles and heavy ions, a significant number of the radiation-induced electron-hole pairs produced by scattering are lost due to recombination of these pairs in the plasma column created by the particle track. This recombination can be reduced, if not eliminated, by use of higher electrical fields within the host material (a-Si:H) in order to separate the charges in the plasma more rapidly and move them toward their respective electrodes. The highest reverse bias applied to a conventional p-i-n or Schottky diode in connection with an a-Si:H material is limited by microplasma breakdown at the surface of the silicon. Use of a buried p-i-n structure such as the p-i-p-i-n-i-n structure shown in FIG. 10A, suppresses this breakdown by moving the region of maximum electrical field away from the surface into the interior of the silicon where the breakdown field is much higher. Using a 5.7 μm thick a-Si:H layer with a buried p-i-n structure, we find that we can raise the electrical field to 50 volts/μm or even higher, as compared to a limit of about 20 volts/μm for a conventional p-i-n device of thickness 5 μm. The doping levels of the outer p+ and n+ layers are preferably about $10^{18}$ cm$^{-3}$ active donor or acceptors. Use of a p-i-p-i-n-i-n structure is discussed in a related patent application, U.S. patent application Ser. No. 07/342,233, filed Apr. 21, 1989 and assigned to the assignee of this application.

Figure 10A:
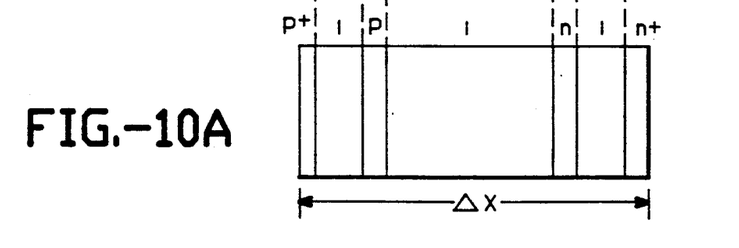
FIG. 10a is a plan of the doping pattern of semiconductor material, as a function of position along one axis, in one embodiment according to the invention.

FIG. 10b indicates graphically the magnitude of the electrical field developed for the p-i-p-i-n-i-n structure shown in FIG. 10a, where the outer p-doped and n-doped regions are highly doped to produce Schottky diodes when metal electrodes are positioned contiguous to these two doped regions. Note that the position of highest electrical field is adjacent to one of the internal or buried doped regions of p type or n type. Preferably, the distance separating the two p doped regions and the distance separating the two n doped regions in FIG. 10a should be less than 0.1 μm in order that the region of maximum electrical field be kept a comfortable distance away from the boundaries of the a-Si:H material. The buried p-i-n structure shown in FIG. 10a will also improve single particle detection of lower linear energy transfer charged particles by providing shorter charge collection time at the electrodes than is produced with use of lower internal electrical fields. Higher count rate and larger signal sizes are also benefits that are available with use of the buried p-i-n structure.

First Application—X-Ray Imager

For high spatial resolution of X-rays and higher wavelength light, the detector element embodiment shown in FIG. 5 may be used in the system embodiment shown in FIG. 1 as a substitute for X-ray film in digital radiography. The X-ray converter layer 109 shown in FIG. 5 might be a 100-500 μm thick, vacuum deposited phosphor columnar structure, or a fiberoptic layer of glass columns impregnated with rare earth fluorescent compounds such as Tb or Eu or other fluorescent compounds such as Ce or Te. The a-Si:H film may have a thickness of 1-5 μm or less for converter material emission wavelengths below 0.7 μm, because the absorption length of silicon for such wavelengths is less than 1 μm. The transverse dimensions of the a-Si:H film may be as low or as high as desired. A suitable cell size might be 30-300 μm. If the converter material emission wavelength is much greater than 0.7 μm, the a-Si:H material can be alloyed with germanium.

X-ray film has a limited dynamic range but has been used for medical imaging because of the film's excellent spatial resolution. Other problems With use of X-ray film include lack of real time resolution, replacement of the film with each exposure and the need for additional processing of the film to obtain digitized images. An imaging plate developed by Fuji and reported by Miyahara et al., *Nuclear Instruments and Methods*, vol. A246 (1986) 572-578, takes care of most of the deficiencies of X-ray film except for real time resolution, but the Fuji system is somewhat bulky and is mechanically delicate. A two-dimensional array of a-Si:H pixel detectors of the kind shown in FIG. 2 can be used to replace X-ray film and take care of all of the above-mentioned deficiencies. A typical X-ray exposure of 0.1 Roentgen will produce about $3 \times 10^9$ 50 keV photons/cm$^2$. About 80 percent of these photons will be absorbed by a 300 $\mu$m thick layer of CsI:Tl converter material 203 and will produce about $6 \times 10^{12}$ converter photons/cm$^2$. Assuming 50 percent photon collection efficiency by an adjacent a-Si:H layer and 60 percent quantum efficiency for electron-hole pair efficiency, an array with $10^4$ pixels per cm$^2$ will produce about $1.8 \times 10^8$ electron-hole pairs within each pixel. If the pixel size is 100 $\mu$m $\times$ 100 $\mu$m $\times$ 1 $\mu$m (thickness), pixel capacitance is about 1 pF, and the average voltage signal on each pixel after a 0.1 R exposure is about 30 volts. Spatial resolution, which is determined by pixel size, may be increased by reducing the pixel size to as small as 30 $\mu$m $\times$ 30 $\mu$m, at the expense of a corresponding reduction in signal/noise ratio and voltage developed across a pixel thickness.

Second Application—Detector for Computer Tomography

For low spatial resolution in the particle fluence or accumulation mode, an array, 1–5 cm. wide, of detector elements, formed as strips of detector material of width 0.1–1 mm and with 0.1–1 mm spacing therebetween, should be adequate. The same converter layer may be used as for the First Application, and the thickness of the a-Si:H material should be at least twice the absorption length in silicon at the emission wavelength of interest.

Figure 11:
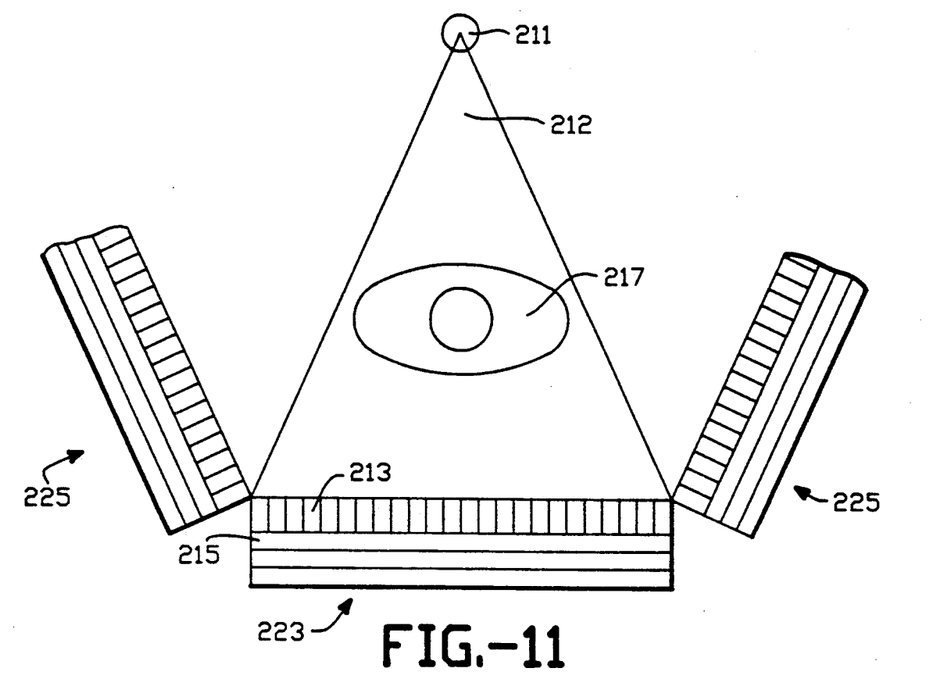
FIG. 11 is a side plan view of a portion of a CT scanner using a radiation detector of the present invention.
Figure 12:
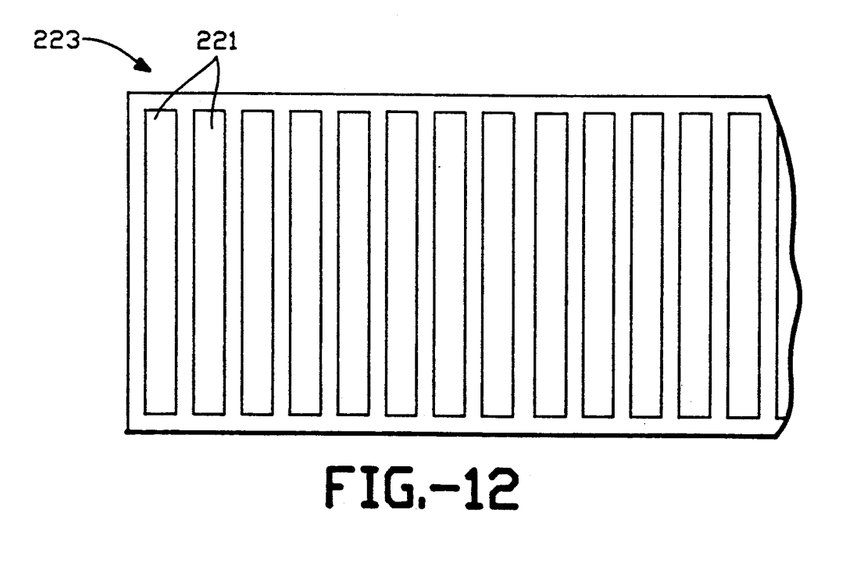
FIG. 12 is a top plan view of a silicon cell arrangement for the radiation detector of FIG. 11.

In FIG. 11, an X-ray tube 211 that emits a radially directed beam 212 of X-rays is rotated around a target, frequently a human body 217, using a one-dimensional converter layer 213 and a position-sensitive detector array ("PSD") 215 for X-rays. Transmission of the X-rays through the patient's body 217 provides a sequence of projection profiles that is stored in the computer for each X-ray tube position. These profiles are used to reconstruct a transverse cross-sectional image of the distribution of X-ray attenuation coefficients. In the prior art, an array of Xe-filled ionization chambers is used as the one-dimensional PSDs. Because of geometrical magnification, the spatial resolution of this system may be low, of the order of a few mm. This gas filled detector array may be replaced by an array of a-Si:H strip detectors as shown in FIG. 12, with associated spatial resolution of the order of 100–1000 $\mu$m. The detectors are used to record flux so that the readout circuit shown in FIG. 7 should be adequate. Arrays of strip detectors are arranged in a polygon, approximating a circle, or a portion thereof, about the body, indicated by the detector array segments 223, 225 and 227 in FIG. 11.

Each detector strip has a lengthwise dimension which is preferably equal to or exceeding the dimension of the impinging beam width on the detector. In this way, the entire beam flux may be measured by a one-detector strip for calibration or synchronization purposes.

With reference to FIG. 12, the details of the strip detector may be seen. Each strip 222 has a plurality of detector cells mounted thereon. The silicon cells are shown to be elongated rectangles 221 having a long dimension of approximately 1 cm or more. The width dimension of each cell is about one millimeter, more or less, with a spacing between cells of less than 1 millimeter.

Third Application—Powder Crystallography

Two methods are available for single photon detection of approximately monochromatic X-rays. The first approach uses powder crystallography techniques and provides a one-dimensional strip or array of detector elements mounted on a curved (e.g., circular) substrate. The a-Si:H cell material is preferably mixed with 1–40 percent by volume of a-Ge:H material to produce a film of thickness 30–50 $\mu$m. With further improvements in the quality of semiconductor materials, the percentage of a-Ge:H material that can be incorporated here may be even greater than 40 percent. The one-dimensional array or strip transverse dimensions might be 0.1-10 mm width (preferably at least 1 mm) by 200—300 cm length and may offer resolution of 50–150 $\mu$m. Low capacitance electrodes, such as the interdigitated electrodes illustrated in FIGS. 9$a$ and 9$b$, should be used here to reduce the electrode capacitance and thereby reduce the system reaction time for single particle detection.

A second approach to X-ray crystallography uses single photon detection of approximately monochromatic X-rays. A two-dimensional detector array approximately 25 cm $\times$ 25 cm in area is provided, with individual pixels 0.1–1 mm in size. The detector is a film of a-Si:H+1–40% of a-Ge:H, the film being 30–50 $\mu$m thick. Germanium has a higher Z and therefore a higher probability of interaction with X-rays, therefore increasing detector efficiency. It is possible to count individual X-rays with this detector.

Figure 13:
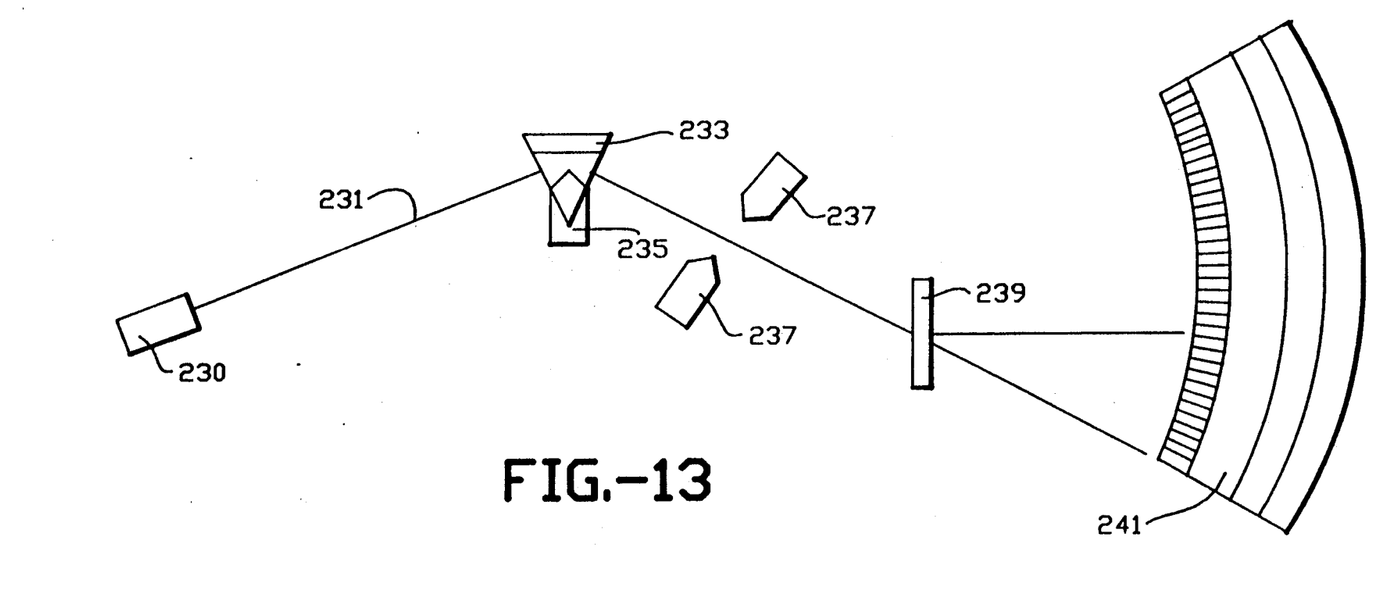
FIG. 13 is a side plan view of a diffractometer using a radiation detector of the present invention.

FIG. 13 shows a typical arrangement of apparatus for X-ray crystallography. X-rays in a beam 231 from a source 230 are reflected by a curved monochrometer 233 and spatially limited by knife edge 235. The beam is further limited by slits 237 and then passed through refracting target 239 before being detected by a curved or flat one-dimensional PSD such as film or multiwire proportional chambers. An a-Si:H detector system 241 placed on a flexible substrate can be used in place of the film or proportional chambers. The diffracted X-ray flux intensity is low in such studies so that single photon detection is preferred over flux integration. Photon energy of at least 6 keV is appropriate for a curvilinear or planar array. One 8 keV X-ray photon creates only about 400 photons in a converter material such as CsI:Tl, and direct detection of such a photon will require careful design of the readout electronics for the expected number of electron-hole pairs (around 300) produced by such photon.

Table II summarizes the probability of photoelectric effect electrons from an 8 keV and a 17 keV photon in three kinds of a-Si:H alloys, namely 100 percent Si, 90 percent Si plus 10 percent Ge, and 80 percent Si plus 20 percent Ge of two different thicknesses. Crystalline Ge requires an average of about 2.7 eV deposited for electron-hole pair produced, which is about 20 percent less than the corresponding value for crystalline Si. Assuming that a similar relationship holds for amorphous Ge as compared to amorphous Si, a larger number of electron-hole pairs should be produced as the percentage of Ge in the alloy is increased, and this is reflected in the entries in Table II. Layer thickness of 30–50 $\mu$m of such an alloy, used in the detector system disclosed here, provides similar detection efficiencies as a pressurized Xe-filled multiwire proportional chamber.

TABLE II

| X-ray Energy | Film Thickness | Detection Efficiency of Si:Ge:H Alloys | | | | | |
|---|---|---|---|---|---|---|---|
| | | 100% Si | | 90% Si + 10% Ge | | 80% Si + 20% Ge | |
| | | 30 μm | 50 μm | 30 μm | 50 μm | 30 μm | 50 μm |
| 8 keV | | 0.37 | 0.53 | 0.45 | 0.63 | 0.53 | 0.72 |
| 17 keV | | 0.051 | 0.083 | 0.18 | 0.28 | 0.31 | 0.46 |

In nondestructive studies of materials employing a flux of higher energy X-rays, either direct or indirect detection of these X-rays may be done using the a-Si:H detector system or the a-Si:Ge:H system disclosed here in the flux counting mode.

Fourth—Application

Tracking Detector for High Energy Physics

Figure 14:
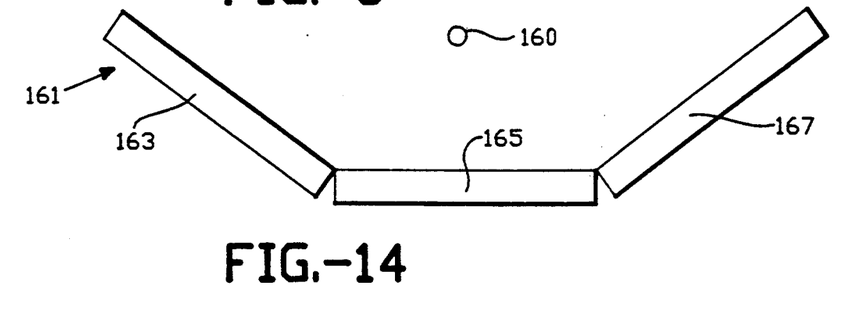
FIG. 14 is a side plan view of a portion of a tracking detector in accord with the present invention.

A plurality of secondary charged particles are often emitted when two or more particles collide in a high energy experiment. In FIG. 14, the beam or beams travel along a central axis 160, colliding at a known location with a target. The secondary particles, and the surviving primary particles, can be detected by positioning a one-dimensional circular or other curvilinear array 161 (r=constant, θ variable) of detectors 163, 165, 167, and so on, approximately in a plane, where the array is centered at the expected collision site. We have demonstrated that minimum ionizing particles—particles with a single electronic charge, and velocity approaching the speed of light, i.e. 95% C, are directly detectable, by use of thick a-Si:H layers formed into small pixels to provide high signal-to-noise ratios. We estimate that, if a 300 μm thick layer of CsI:Tl is placed adjacent to a 5 μm thick layer of an amorphous Si:H cell array with 70 percent (assumed) quantum efficiency, a signal size of 5000–6000 electrons within the a-Si:H is produced by passage of a single primary particle through this system.

Fifth Application—Calorimeter

Figure 15:
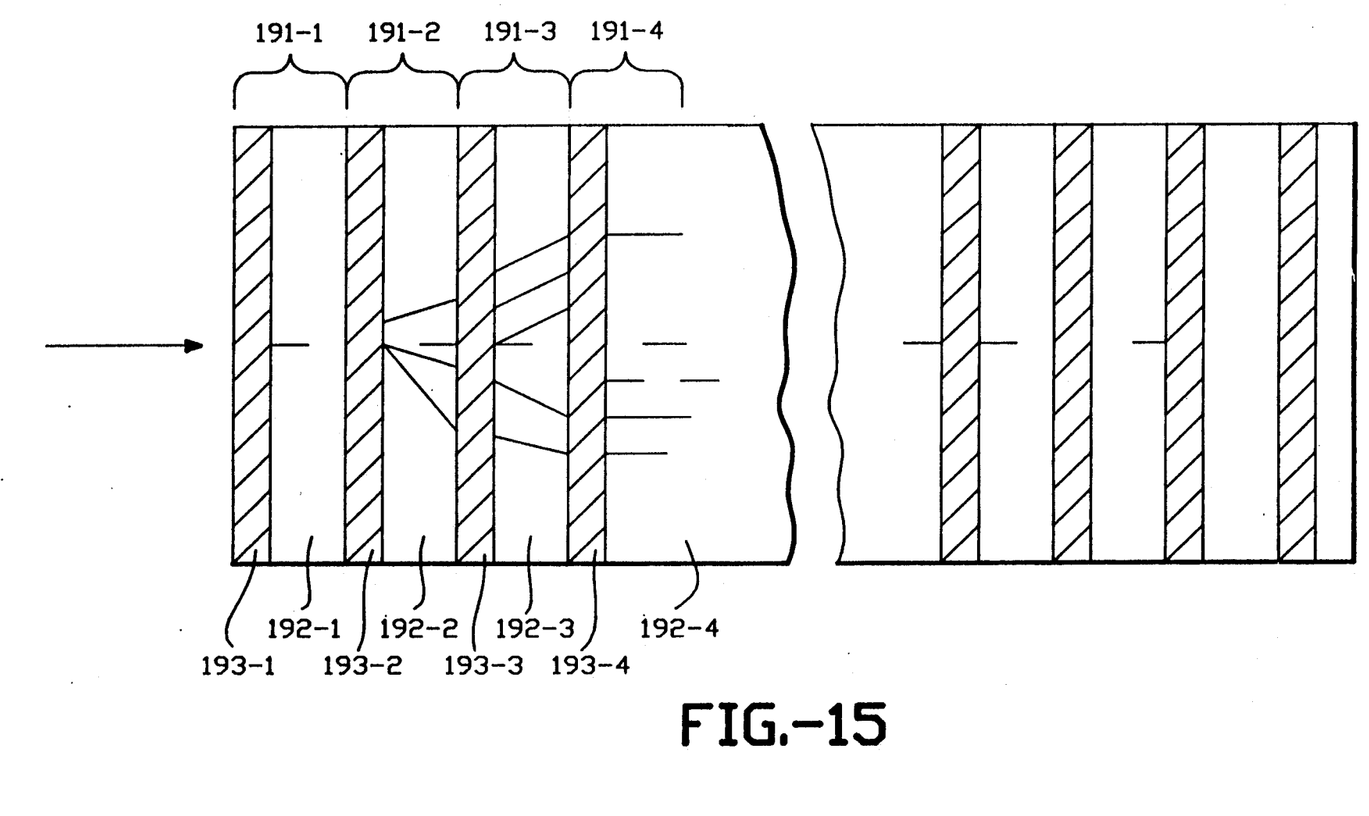
FIG. 15 is a side plan view of a radiation detector of the present invention for use with X-rays.

In a fifth application, a sequence 191-1, 191-2, 191-3, 191-4 of parallel planar arrays of detectors is provided as shown in FIG. 15. A detector planar array such as 191-1 includes a planar array 192-1 of a-Si:H cells and an adjacent layer 193-1 of metallic converter material of high atomic number, such as Pb or U. A high energy X-ray or γ-ray with particle energy at least 10 MeV will produce a shower of photoelectrons and Compton electrons, originating in the converter material and whose paths may reach to or through one or more additional layers of detector material (a-Si:H) and converter material. By recording the number of tracks and positions of the showers, one can determine the energy and the initial direction of the X-ray or γ-ray. The collection of planar arrays 192-1, 192-2, 192-3, 192-4 of pixel detectors may also allow determination of where the incident X-ray or γ-ray first contacted the initial layer 193-1, 193-2, 193-3, 193-4 of converter material. Conventional gas-filled or crystalline Si detectors may be replaced by this a-Si:H detector system. The response of a multi-layer metallic converter material plus a-Si:H system to a particle flux has been studied theoretically by Naruse et al., *I.E.E.E. Trans. on Nuclear Science*, vol. 36 (1989), 1347–1352, but no means was disclosed for selectively reading out the response of individual detector element.

Sixth Application—Nuclear Medicine Camera

In nuclear medicine, radiopharmaceuticals are introduced into the body, and gamma rays emitted from various parts of the body are detected to give an image of the radionuclide distribution. Here, individual gamma rays are to be counted so that the readout system is somewhat more elaborate. A scintillation camera is one type of imaging device used for such purposes. This camera consists of a slab of NaI:Tl coupled to a plurality of photomultiplier tubes (PMTs). Centroid calculation of the PMT output signals gives position information of the incident gamma ray, and the sum of all the PMT signals determines the energy of the gamma ray.

A mechanical collimator is placed in front of the scintillator to accept only the desired gamma rays in order to construct an image of the radionuclide distribution in the body, as projected on a plane defined by the scintillator slab. The scintillator camera system can be replaced by an a-Si:H detector system having a high light yield converter layer as shown schematically in FIG. 15. Here, the converter material must be carefully chosen, and CsI:Tl or pure CsI appear most promising because of their high light yield, high Z number and their built-in columnar structure. The thickness of the CsI converter material should be more than 5 mm in order to insure good detection efficiency for the most commonly used 140 keV gamma rays from compounds such as Tc-99m. The intrinsic spatial resolution of conventional scintillation cameras is about 3 mm.

Figure 16:
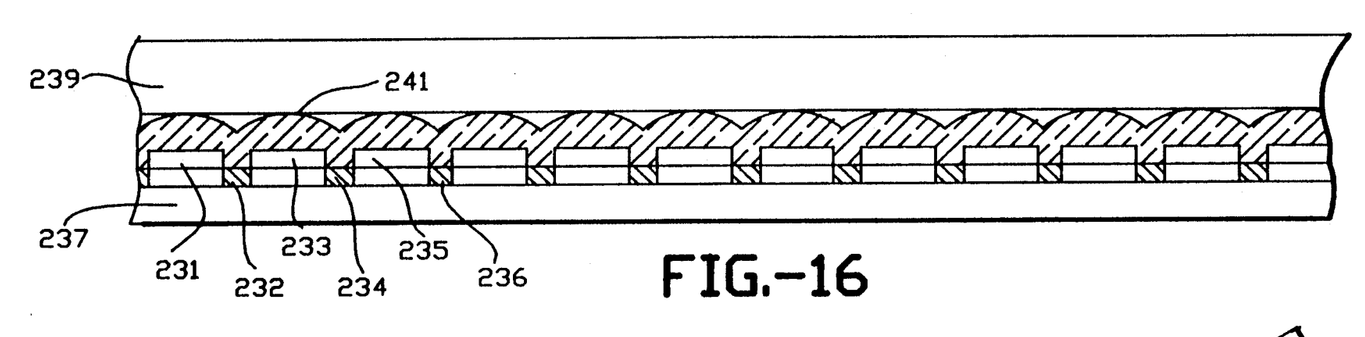
FIG. 16 is a side plan view of a planar radiation detector employing a lenticular array in accord with the present invention.

The a-Si:H detector system shown in FIG. 16 can provide much higher spatial resolution if required. This system does not use PMTs so that it is more compact and lightweight and does not require the constant adjustments that a PMT array requires. In FIG. 16, a plurality of amorphous silicon cells 231, 233, 235 and so on, are slightly spaced apart by an equal distance, allowing associated electrodes 232, 234, 236 and so on, to be spaced between the silicon cells in the manner indicated in FIG. 4. The amorphous silicon cells and electrodes are supported on substrate 237 and are spaced below a layer of converter material 239. Immediately below the converter material 239 is a lenticular array 241 consisting of a plurality of glass lenses which focus light generated in the converter material on the detector cells. The lenses have very short focal lengths so as to be very wide angle lenses. By providing a lens for each amorphous silicon cell, the size of the cells may be reduced, thereby reducing the capacitance and the leakage current, without loss of resolution.

While this embodiment employing lenses is not necessary for a nuclear medicine camera, it is advantageous where a relatively large area array is needed, with medium to high resolution.

Seventh Application—Autoradiography

In biology, autoradiography uses techniques of chromatography and electrophoresis to extract information on protein distributions and DNA sequences from radioisotope-labeled plates of organic bodies.

Radioisotopes commonly used for such studies include $^3H$, $^{14}C$, $^{32}P$ and $^{35}S$. In the case of isotopes, frequently beta-emitters are used with maximum energies of 18 keV, 155 keV and 1.7 MeV, respectively. Positions and intensity distributions of these beta emitters are determined by detecting the beta particles escaping from the plate or the gel with a one-dimensional PSD or a two-dimensional PSD maintained in close contact with the body. In the prior art, X-ray film and multiwire proportional chambers have been applied for such studies. To insure sufficient sensitivity, the thickness of a gasfilled detector is about 1 cm or larger, which causes spatial resolution degradation due to the parallax error involved.

Now, single beta particle detection for these isotopes can be done using the a-Si:H radiation detector system either directly or indirectly, with the exception of the radioisotope $^3$H. The detector arrangement would resemble FIG. 2 or FIG. 4, with a thickness which can be less than 1 mm. The sensitive area can be placed quite close to the plates or gels. Amorphous silicon cell size would be about 300 $\mu$ on a side. Detection using the radioisotope $^3$H will require careful design of the readout electronics due to the small signal size, but this is a problem with any detector system that uses this radioisotope.

Beta particles are emitted from $^3$H, $^{14}$C, $^{32}$P and $^{35}$S, with the maximum beta particle energy emitted from $^{35}$S being 0.167 MeV. A one dimensional application includes labeling using a strip detector array approximately 1 cm × 10 cm, with a sequence of 30–50 $\mu$m thickness, a-Si:H pixel detectors with strip contacts 0.1 mm × 0.5 mm. Such an array would resemble the array of FIG. 12. Again, one problem is the low counting rate associated with the sample, especially where emissions from H$_3$ are monitored. The counting rates are typically less than 100/scc/strip.

In two-dimensional studies, the area detector would be of the order of 25 cm × 25 cm in area and resemble the layout of FIGS. 2, 3 or 4. The a-Si:H pixels of thickness 30–50 $\mu$m and of individual size 0.3 mm × 0.5 mm may be used, with counting rates typically less than $10^4$/scc over the entire pixel detector array.

We claim:

1. Detector elements in an array of such elements for high energy particles or photons that move through the detector, with each detector element comprising:

first and second electrodes lying in approximately parallel planes and being spaced apart from each other;

an amorphous film including a mixture of at least 60 percent Si:H and at most 40 percent Ge:H, deposited approximately in a plane positioned between and adjacent to the first and second electrodes, the film having at least three contiguous regions, a first region of first electrical conductivity type adjacent to the first electrode, a second region of second electrical conductivity type opposite to the first conductivity type adjacent to the second electrode, and an intrinsic region positioned between the first and second regions where the first and second regions have smaller thickness than the thickness of the intrinsic region;

bias means, electrically connected to the first and second electrodes, for impressing an electrical field between the first and second electrodes; and readout means, positioned adjacent to the first and second electrodes and electrically connected thereto, for selectively reading the voltage or current developed across the amorphous film.

2. An assembly of detector elements, each constructed according to claim 1 for detecting individual photons of photon energy at least 6 keV, the detector comprising:

a curvilinear array of detector elements, wherein each of said amorphous films is formed as a strip of thickness at least 30 $\mu$m.

3. The assembly of claim 2 wherein said first and second electrodes are each formed as a comb having two or more teeth, the combs being interdigitated when viewed in a direction perpendicular to said planes in which said electrodes lie.

4. The assembly of detector elements, each constructed according to claim 1, for detecting individual photons of photon energy at least 6 keV, the detector comprising:

an approximately planar rectangular array of detector elements, wherein each of said amorphous films has a thickness of at least 30 $\mu$m.

5. The detector assembly of claim 4, wherein said first and second electrodes are each formed as a comb having two or more teeth, the two combs being interdigitated when viewed in a direction perpendicular to said planes in which said electrodes lie.

6. Detector elements according to claim 1, wherein said array of detector elements is a two-dimensional array, with each detector element being addressable by two signals that specify two-dimensional coordinates of a detector element.

7. Detector elements according to claim 1, having a layer of luminescent material drawn from the class of phosphors that emit visible wavelength radiation and that consists of CaWO$_4$, BaSrSO$_4$, GdO$_2$S:Th, LaOBr:Tb, BaPbSO$_4$, Y$_2$O$_2$S:Tb, BaFCl:Eu, (ZnCd)S:Ag, CsI, CsI:Na, CsI:Tl and NaI:Tl.

8. Detector elements according to claim 7, wherein said luminescent material has a columnar structure with a plurality of columns, each column having a longitudinal axis that is oriented approximately perpendicular to the plane of said amorphous film and having a diameter, measured transverse to its longitudinal axis, in the range of 10–100 $\mu$m.

9. Detector elements according to claim 8, wherein said columnar structure is formed as a plurality of fiber optic columns that are impregnated with a fluorescent material.

10. Particle detector elements in an array of such elements, for detecting the presence of high energy particles that move through the detector element array, with each detector element comprising:

first and second electrodes lying in approximately parallel planes spaced apart from each other;

an amorphous Si:H film deposited adjacent to each of the first and second electrodes, the film having at least seven contiguous regions, a first highly doped region of first conductivity type positioned adjacent to the first electrode, a second highly doped region of second conductivity type opposite to the first conductivity type and positioned adjacent to the second electrode, a third region of first conductivity type positioned between and spaced apart from the first and second regions, a fourth region of second conductivity type positioned between and spaced apart from the second and third regions, a fifth intrinsic conductivity region positioned between the first and third regions, a sixth intrinsic conductivity region positioned between the second and fourth regions, and a seventh intrinsic conductivity region positioned between the third and fourth regions, where the intrinsic regions have a low charged particle trap density and the first, second, third and fourth regions have smaller thicknesses than the thicknesses of the intrinsic regions;

bias means, electrically connected to the first and second electrodes, for impressing an electrical field between these two electrodes;

a layer of luminescent material, positioned adjacent to the Si:H film, the luminescent material having a characteristic wavelength of light emission from an excited state that is no more than 0.8 μm, and the luminescent material layer having a plurality of columns with longitudinal axes of the columns being oriented approximately perpendicular to an adjacent surface of the Si:H film; and readout means, positioned adjacent to the first and second electrodes and electrically connected to these two electrodes, for selectively reading the voltage or current developed across the Si:H film in response to passage of high energy particles through the detector elements.

11. Detector elements according to claim 10, wherein said array of detector elements is a two-dimensional array, with each detector element being addressable by two signals that specify two-dimensional coordinates of a detector element.

12. Detector elements according to claim 10, wherein said luminescent material has a columnar structure with a plurality of columns, each column having a longitudinal axis that is oriented approximately perpendicular to the plane of said adjacent amorphous film and having a diameter, measured transverse to its longitudinal axis, the range of 10–100 μm.

13. Detector elements according to claim 12, wherein said columnar structure is formed as a plurality of fiber optic columns that are impregnated with a fluorescent material.

14. Detector elements according to claim 10, wherein said luminescent material is drawn from the class of phosphors that emit visible wavelength radiation and that consists of $CaWO_4$, $BaSrSO_4$, $GdO_2S:Th$, $LaOBr:Tb$, $BaPbSO_4$, $Y_2O_2S:Tb$, $BaFCl:Eu$, $(ZnCd)S:Ag$, $CsI$, $CsI:Na$, $CsI:Tl$ and $NaI:Tl$.

15. The apparatus of claim 10, wherein each of said first and second electrodes is formed as a comb having two or more teeth and the two combs are interdigitated, when viewed in a direction perpendicular to the planes in which said first electrode and said second electrode lie.

* * * * *